United States Patent [19]
Nishida et al.

[11] Patent Number: 5,403,751
[45] Date of Patent: Apr. 4, 1995

[54] PROCESS FOR PRODUCING A THIN SILICON SOLAR CELL

[75] Inventors: Shoji Nishida, Fujisawa; Kenji Yamagata, Kawasaki, both of Japan

[73] Assignee: Canon Kabushiki Kaisha, Tokyo, Japan

[21] Appl. No.: 262,381

[22] Filed: Jun. 20, 1994

Related U.S. Application Data

[63] Continuation of Ser. No. 915,693, Jul. 27, 1992, abandoned.

[30] Foreign Application Priority Data

Nov. 29, 1990 [JP] Japan .................. 2-332231

[51] Int. Cl.$^6$ .................. H01L 21/20; H01L 21/329
[52] U.S. Cl. .................. 437/2; 437/89; 437/4; 148/DIG. 153
[58] Field of Search .................. 437/2, 4, 89, 228; 136/258 PC; 148/DIG. 153

[56] References Cited

U.S. PATENT DOCUMENTS

| | | |
|---|---|---|
| 4,578,142 | 3/1986 | Corboy, Jr. et al. . |
| 4,816,420 | 3/1989 | Bozler et al. .................. 437/2 |
| 5,103,851 | 4/1992 | Nishida et al. . |

FOREIGN PATENT DOCUMENTS

| | | |
|---|---|---|
| 8102948 | 10/1981 | European Pat. Off. . |
| 58-56330 | 4/1983 | Japan . |
| 59-18655 | 1/1984 | Japan . |
| 62-86838 | 4/1987 | Japan . |
| 63-98120 | 4/1988 | Japan . |

OTHER PUBLICATIONS

Japanese Journal of Applied Physics, Part 2, vol. 22, No. 12, L783—85 (Dec. 1983).

*Primary Examiner*—George Fourson
*Attorney, Agent, or Firm*—Fitzpatrick, Cella, Harper & Scinto

[57] ABSTRACT

A process for the production of a solar cell, characterized in that the surface of a silicon wafer is periodically exposed through minute spaced portions of an insulating layer formed on the silicon wafer; crystal growth is performed until monocrystalline silicon regions caused at the spaced portions by way of selective epitaxial growth and lateral crystal growth become collided with each other; the insulating layer is removed through gaps left among the monocrystals; a resin is embedded in the gaps; an electrode layer is formed over the surfaces of the monocrystalline silicon regions; the surface of the electrode layer is fastened to a substrate through a resin; a body comprising the monocrystalline silicon regions is separated from the silicon wafer; and a counter electrode is disposed to the monocrystalline silicon regions.

7 Claims, 14 Drawing Sheets

SiO2

SiO2

Si3N4

SiO2

PROCESS FOR PRODUCING A THIN SILICON SOLAR CELL

This application is a continuation of application Ser. No. 07/915,693, filed Jul. 27, 1992, which is now abandoned.

FIELD OF THE INVENTION

The present invention relates to a process for producing a thin silicon solar cell which provides an improved photoelectric conversion efficiency.

BACKGROUND OF THE INVENTION

Solar cells have been utilized as a driving energy source in various devices.

Solar cells have a pn junction at their active portion, and silicon is generally used as the semiconductor to constitute such pn junction. It is generally recognized that the use of a single crystal silicon is desirable in view of converting light energy into an electromotive force and that the use of an amorphous silicon is desirable in view of enlarging the area while reducing the production cost.

In recent years, studies have been made of polycrystalline silicons in order to attain reduction in the production cost to the level of that for an amorphous silicon and to attain a high energy conversion efficiency similar to that by a single crystal silicon. None of the methods proposed in the past are sufficient in view of efficient utilization of a material, since a plate-like material is used which is obtained by slicing a polycrystalline lump. It is difficult to make said plate-like material to be less than 0.3 mm in thickness. Because of this, said plate-like material unavoidably becomes thicker than that required for sufficient absorption of light. In other words, it is still necessary to make the corresponding material thinner in order to attain reduction in the production cost.

In view of the above, an attempt has been made to form a polycrystalline silicon thin film by means of a thin film-forming technique such as a chemical vapor deposition process (CVD process). However, the resulting product has a crystal grain size of the order of about $10^{-2}$ microns and is inferior to the resultant obtained by the massive polycrystalline silicon-slicing method in view of energy conversion efficiency.

An attempt has been made to enlarge the crystal grain size of a polycrystalline silicon thin film formed by means of the CVD process by subjecting the thin film to light irradiation to fuse the thin film, followed by recrystallization. However, this attempt is not sufficient to reduce the production cost, wherein it is difficult to attain stable production.

These situations are problematic not only in the case of silicon materials but also in the case of compound semiconductors.

Now, U.S. Pat. No. 4,816,420 discloses a process of producing a thin crystal system solar cell. The solar cell-producing process disclosed in this U.S. patent is characterized by forming a sheet-like crystal on a crystal substrate by selective epitaxial growth and lateral crystal growth through a masking member and removing said crystal from the substrate.

In this method, the exposed portions formed through the masking member are arranged in a line-like state. Removal of the sheet-like crystal grown by selective epitaxial growth and lateral crystal growth depending on the line-like crystal seeds is carried out by mechanically peeling it utilizing the cleavages thereof. However, there is a problem where the crystal seeds in line-like state are above a certain size, the area in contact with the substrate is increased. Because of this, the sheet-like crystal is often damaged during removal thereof. Particularly, in the case of enlarging the area of a solar cell, how much the line width should be narrowed (practically, about 1 $\mu$m), a serious problem arises in the case where the line length is of an extent of some millimeters to some centimeters or above.

The above U.S. patent describes an example wherein $SiO_2$ is used as the masking member and a silicon thin film is grown by way of selective epitaxial growth and lateral crystal growth at a substrate temperature of 1000° C.

It is known that at such a high substrate temperature, a grown silicon layer reacts with $SiO_2$ to introduce remarkable stacking faults (plane defects) into the silicon layer side in the vicinity of the interface between the silicon layer and the $SiO_2$. These defects impart seriously negative influences to the characteristics of a solar cell obtained.

On the other hand, it is reported that the defect density of the film is reduced as the film-growing temperature is lowered. (see, H. Kitajima, A. Ishitani, N. Endo and K. Tanno, Jpn. J. Appl. Phys. 22, L783 (1983))

In this case, however it is extremely difficult to attain the film thickness required for the formation of a solar cell since the film-growing speed is markedly reduced.

SUMMARY OF THE INVENTION

The principal object of the present invention is to eliminate the foregoing problems in the prior art and to provide a process which makes it possible to efficiently produce a high quality thin silicon solar cell.

Another object of the present invention is to provide a process which makes it possible to obtain an improved solar cell at a reduced production cost by transferring a thin semiconductor layer formed on a silicon wafer onto a substrate such as a glass substrate or the like.

A further object of the present invention is to provide a process which makes it possible to efficiently produce a high quality solar cell by performing selective crystal growth through an insulating layer while decreasing occurrence of defects in the crystal grown in the vicinity of the interface between the grown crystal and the insulating layer.

The present invention has been accomplished as a result of intensive studies by the present inventors in order to overcome the foregoing problems in the prior art and in order to attain the above objects. The present invention relates to a process which makes it possible to efficiently produce a thin silicon solar cell which exhibits excellent solar cell characteristics.

The process for the production of a solar cell is of the constitution which will be described below.

That is, a process for the production of a solar cell which comprises the steps of:

(i) forming an insulating layer on a silicon wafer, (ii) forming intermittent minute openings on the insulating layer to expose surface portions of the silicon wafer through said minute openings, (iii) performing selective epitaxial growth and lateral crystal growth at the silicon crystal portions exposed through the minute openings until monocrystalline silicon regions grown at the minute openings collide with each other, (iv) removing the insulating layer through gaps left among the monocrystalline silicon regions, (v) embedding a resin in the gaps, (vi) forming an electrode layer over the surfaces of the monocrystalline silicon regions and fastening the surface thereof to a substrate through a resin, (vii) separating the monocrystalline silicon regions from the silicon wafer, and (viii) forming a counter electrode at the separated monocrystalline silicon regions, wherein the angular single-crystallines grown have a defect density of $1 \times 10^4$ cm$^{-1}$ or less at the interface with the insulating layer or an impurity is added at the initial stage in the step of growing the monocrystalline silicon regions.

According to the present invention, it is possible to transfer a polycrystal thin film solar cell with a high photoelectric conversion efficiency formed on a wafer onto a base member made of glass or the like, and hence, a high quality thin solar cell can be mass-produced at a reduced production cost.

DETAILED DESCRIPTION OF THE PREFERRED EMBODIMENTS

Figure 2:
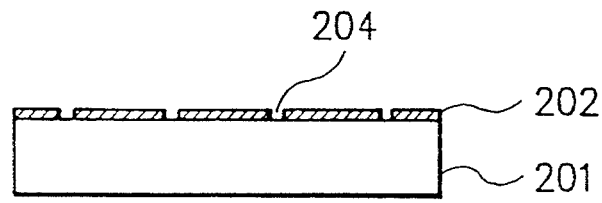
FIGS. 2(A)-2(D) are explanatory views of the selective crystal growing method.
Figure 2:
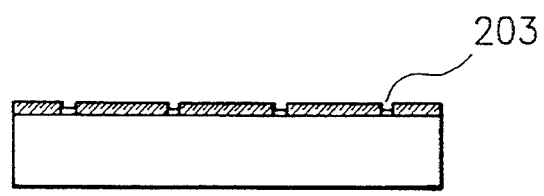
Figure 2:
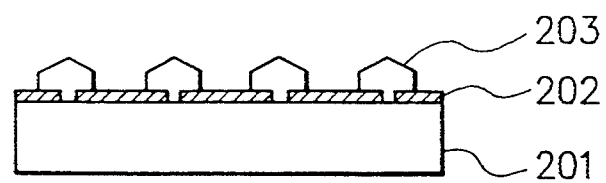
Figure 2:
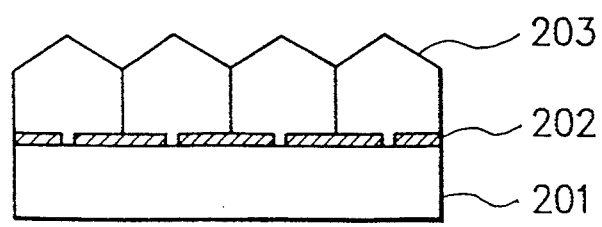

The technical gist of the present invention lies in the formation of a polycrystal silicon thin film comprising a lump of monocrystalline silicon regions with a uniform crystal orientation and a uniform crystal grain size by way of selective epitaxial growth and successive lateral crystal growth using a surface incapable of forming a crystalline nucleus and regions with silicon seed portions formed on a silicon wafer as shown in FIG. 2.

Herein, a brief explanation will be made of the principle with respect to the selective epitaxial growth method. The selective epitaxial growth method is a method wherein in the case of performing epitaxial growth by means of a vapor phase epitaxy, as shown in FIG. 2(A) and FIG. 2(B), under the condition that the formation of crystalline nucleus is not caused on an insulating layer comprising an oxide film or the like which is formed on a silicon wafer, the epitaxial growth is carried out only at spaced portions formed at the insulating layer using the silicon surfaces exposed through the spaced portions as a seed crystal. In the case where an epitaxial layer embedded in the spaced portions still continues to grow, the crystal layer is also laterally grown along the surface of the insulating layer while continuing the longitudinal growth. This is the so-called epitaxial lateral overgrowth. When the lateral crystal growth is continued, silicon crystals grown from different spaced portions collide with each other to finally provide a continuous film. The growth ratio between the longitudinal crystal growth rate and the lateral crystal growth rate and appearance of a facet at this time generally depend upon the crystal growing conditions, the plane azimuth of a substrate used, the thickness of an insulating layer used and the shape of a opening formed at the insulating layer.

Figure 3A:
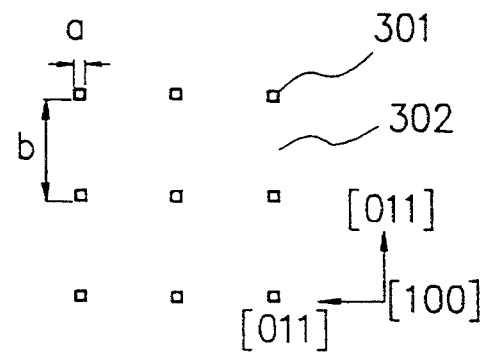
FIGS. 3(A)-3(C) are views explaining the process of an angular crystal formed according to the process of the present invention where the crystal is three-dimensionally grown.

As a result of repeated experiments by the present inventors, it was found that three-dimensional crystal growth is caused on the insulating layer with a growth ratio of substantially 1 between the longitudinal crystal growth rate and the lateral crystal growth rate without depending on the thickness of the insulating layer when the openings are made to be minute regions with a size on the order of several microns or smaller. Distinct facets appear to provide monocrystalline regions, which are followed to collide with each other whereby a continuous film is formed (see, FIG. 2 and FIG. 3).

In the above, it was found that before the formation of the continuous film is complete, particularly in a state that gaps still remain among the monocrystalline silicon regions, the entire insulating layer can be substantially removed through those gaps by an etching technique. As a result of this, a polycrystal thin film comprising a lump of the monocrystalline can be easily separated from the silicon wafer.

Figure 4:
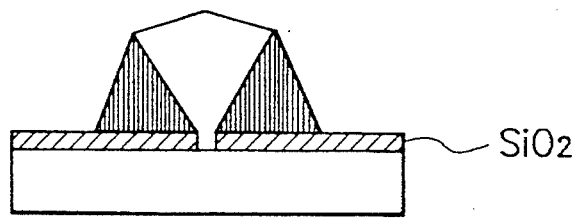
FIGS. 4(A)-4(D) are views explaining the situation where defects liable to get into the crystal are being decreased by the process of the present invention.
Figure 4:
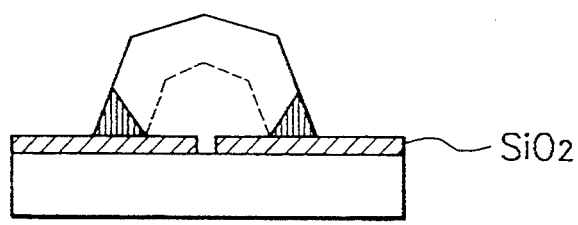
Figure 4:
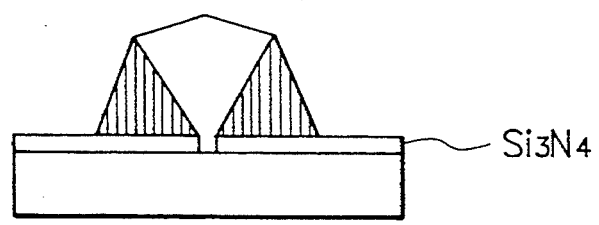
Figure 4:
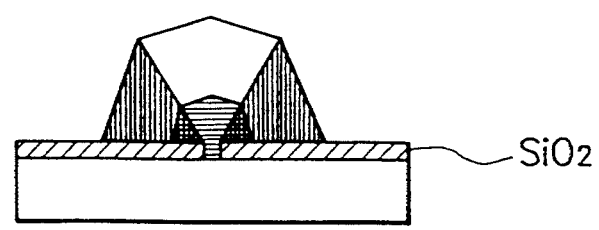

In addition, as a result of further repeated experiments, the present inventors obtained the following finding. It was found that when the insulating layer formed on a silicon wafer is composed of $SiO_2$ as shown in FIG. 4(A), the problem in the prior art that a great many lamination defects occur in the vicinity of the interface with the insulating layer around the spaced portion can be markedly decreased as illustrated in FIG. 4(B) or FIG. 4(C) by controlling the growth temperature upon crystal growing so that the initial growth temperature is lowered and is gradually heightened. Or by replacing the constituent $SiO_2$ of the insulating layer by $Si_3N_4$, wherein especially in the case of FIG. 4(B), a continuous thin film with few defects at the interface can be obtained without the effective crystal-growing rate being substantially reduced.

Further in addition, as a result of still further repeated experiments, the present inventors obtained the following finding. It was found that in relation to the defects shown in FIG. 4(A), when an impurity is intentionally introduced to activate a region, a high quality crystal layer with few defects is grown thereon, and the crystal layer is used as an active region as illustrated in FIG. 4(D), there is afforded a high quality semiconductor layer.

The present invention has been accomplished as a result of further research based on these findings.

In the following, the experiments which were conducted by the present inventors will be described.

Experiment 1

(selective crystal growth)

Figure 7:
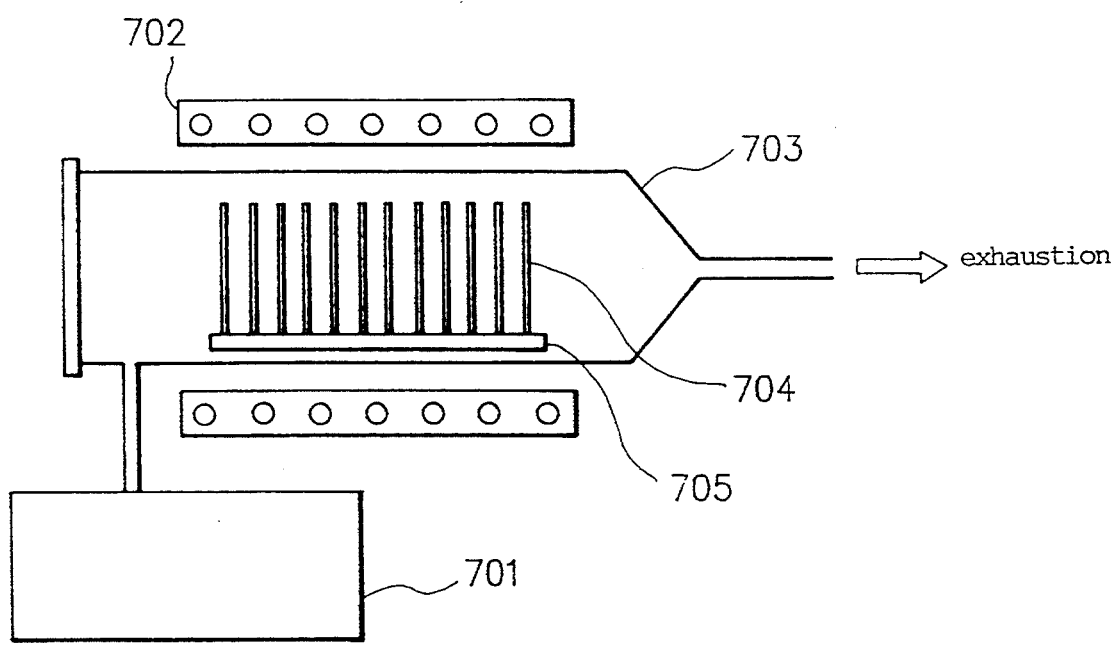
FIG. 7 is a schematic diagram of a conventional low pressure CVD apparatus.

As shown in FIG. 2(A), on a 500 μm thick silicon wafer of (100) 201 was formed a 1000 Å thick oxide film by means of thermal oxidation, followed by etching using photolithography, whereby forming a plurality of spaced porions in the form of a square shape of a in edge size at an interval of b=50 μm. Wherein, the spaced square portions were made different with the value a being 1.2 μm, 2 μm and 4 μm, respectively. Then, selective crystal growth was performed using a conventional low pressure CVD apparatus of the constitution shown in FIG. 7, wherein there were used $SiH_2Cl_2$ as the raw material gas and $H_2$ as the carrier gas, and HCl was added in order to prevent generation of a crystalline nucleus on the oxide film as the insulating layer. The crystal growing conditions at this time are shown in Table 1.

Figure 3B:
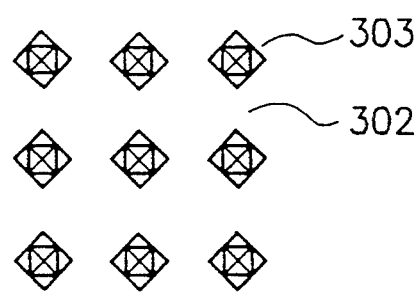

After the crystal growth was completed, the surface state of the wafer was observed by an optical microscope. As a result, it was found that single-crystallines 203 (303) respectively having an angular facet with a grain size of about 20 μm with respect to the value a are regularly arranged at an interval of 50 μm respectively on the corresponding lattice point as shown in FIG. 2(C) or FIG. 3(B) and that the selective crystal growth is accomplished depending on the pattern of each of the spaced portions 301 predetermined in FIG. 3(A). The rate occupied by the crystal grown at the spaced portion in this case was found to be 100% as for each of the values of the a. In addition, it was found that the rate of the facets distinctly appeared without being deformed among the grown monocrystalline silicon regions, and depends upon the value of the a. The rate of the deformed facets is decreased as the value of the a is lowered as shown in Table 2.

All the monocrystalline silicon regions obtained were found to be of a complete orientation and to succeed to the crystal orientation of the silicon wafer as the substrate.

Figure 3C:
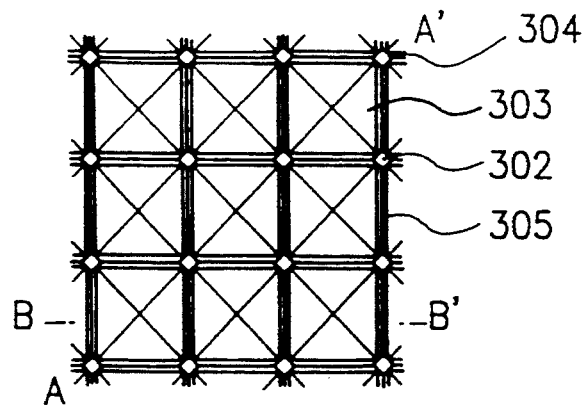

Next, under the conditions shown in Table 1, the crystal growth was performed for a prolonged crystal growing period of 90 minutes. After the crystal growth was completed, the surface state of the wafer was observed by an optical microscope. As a result, it was found that every adjacent monocrystalline silicon regions 203 (303) completely contact each other to form a polycrystal thin film comprising a lump composed of monocrystalline silicon regions having a top appearance such that they are orderly arranged in cell-like state as shown in FIG. 2(D) or FIG. 3(C). Each of the single-crystallines in this case was found to have a height of about 40 μm distance from the surface of the oxide film 202.

The polycrystal film was cleaved along line B—B' shown in FIG. 3(C), the cross section of the resulting product was ground, followed by defect-actualization treatment by means of Secco-etching. The states near the grain boundaries were observed by a scanning electron microscope. As a result, the distinct interface as found in the case of a conventional polycrystal silicon with irregular crystal orientations was not found. Numerous defects, which are corresponding to those in the case of FIG. 4(A), were found to be present in the vicinity with the oxide film. The plane defect density in this case was found to be about $7 \times 10^4$ cm$^{-1}$.

Further as shown in FIG. 3(C), as for the polycrystal film obtained, it was found that gaps 304 of about 8 μm in size remain among the single crystallines 303 and the oxide film 302 as the insulating layer is intermittently exposed through these gaps.

These gaps can be completely eliminated by further prolonging the crystal growing period. This situation was confirmed by other experiment.

Experiment 2

(removal of the insulating layer)

Removal of the insulating layer situated under the polycrystal thin film utilizing the foregoing gaps.

The silicon wafer having the polycrystal thin film having the gaps grown thereon which was obtained in Experiment 1 was immersed in an aqueous solution of HF with a concentration of 49%, followed by allowing to stand for 24 hours. Thereafter, after having been washed with water and dried, the surface of the wafer was observed by an optical microscope and a scanning electron microscope. As a result, the presence of the oxide film was not found in any of the gaps of the polycrystal thin film. Then, epoxy resin was applied on the surface of the polycrystal thin film and a glass plate was then affixed thereto. After the epoxy resin was cured, an attempt was made to separate the glass plate from the wafer. As a result, the polycrystal thin film could be separated from the wafer while the entire polycrystal film was transferred onto the glass plate. The separated reverse side of the polycrystal thin film was observed by an optical microscope and a scanning electron microscope. It was found that almost all the oxide film is etched off where silicon crystal is exposed, although the oxide film partly remains.

Experiment 3

(control of the defect density depending upon the crystal growing temperature)

An attempt was made to control the defects by regulating the crystal growing temperature at the time of performing crystal growth. As above described, it is reported that the density of defects incorporated into the crystal formed on a $SiO_2$ in the vicinity of the interface with the $SiO_2$ is varied depending upon the temperature upon performing the crystal growth and the lower the crystal growing temperature is, the lower the defect density is. (see, H. Kitajima, A. Ishitani, N. Endo and K. Tanno, Jpn. J. Appl. Phys. 22, L783 (1983))

However, although a high quality crystal is afforded when the crystal growing temperature is lowered, it is difficult to grow angular polycrystals and to contact them with each other whereby forming a polycrystal film in that case.

In view of the above, an experiment was conducted in order to observe whether or not a crystal with a reduced defect density in the crystal region serving as a pathway for photoelectric current in the vicinity of the $SiO_2$ interface is obtained by stepwise changing the crystal growing temperature in two steps, while having a due consideration about the constitution of a solar cell to be produced.

There was used a substrate of the same kind as that used in Experiment 1. Crystal growth was performed while continuously changing the crystal growing temperature in two steps under the conditions shown in Table 3. As a result, there was obtained a continuous polycrystal film as shown in FIG. 2(D) or FIG. 3(C). The polycrystal film was cleaved along line B—B' shown in FIG. 3(C), the cross section of the resulting product was ground, followed by defect-actualization treatment by means of Secco-etching. The result was examined using a scanning electron microscope. It was found that the defect density in the region around the spaced portion in the vicinity of the interface with the oxide film is significantly reduced as shown in FIG. 4(B), and it is about $1 \times 10^3$ cm$^{-1}$. Thus, it was found that a continuous polycrystal silicon film with few defects in the vicinity of the SiO$_2$ interface can be obtained by continuously performing the crystal growth while stepwise changing the crystal growing temperature in two steps.

Experiment 4

(defect density on Si$_3$N$_4$)

It is considered that the reaction of SiO$_2$ with a-Si-crystal is one of the factors to cause crystal defects. In view of this, an experiment was conducted using Si$_3$N$_4$ instead of the SiO$_2$ as the insulating layer.

As for the Si$_3$N$_4$, using a conventional low pressure CVD apparatus, SiH$_2$Cl$_2$ and NH$_3$ were subjected to thermal decomposition to thereby deposit a 1000 Å thick Si$_3$N$_4$ film on a silicon wafer.

Using the resultant obtained, crystal growth was performed in the same manner as in Experiment 1 under the conditions shown in Table 1. Following the procedures of Experiment 3, the defect density in the crystal in the vicinity of the interface with the Si$_3$N$_4$ layer was measured. As a result, it was found that the defect density is smaller than that in the case of the SiO$_2$ as shown in FIG. 4(C), and it is about $1 \times 10^4$ cm$^{-1}$.

Thus, it was found that the defect density can be improved by changing the constituent of the insulating layer to Si$_3$N$_4$.

Experiment 5

(reduction of the defects by changing the crystal growing temperature and using Si$_3$N$_4$)

On the basis of the results obtained in Experiments 3 and 4, crystal growth was performed using Si$_3$N$_4$ as the insulating layer in the same manner as in Experiment 3 under the conditions shown in Table 3. As for the continuous polycrystal film grown, the defect density in the crystal in the vicinity of the interface with the Si$_3$N$_4$ layer was measured in the same manner as in Experiments 3 and 4. As a result, there was observed such reduction as shown in FIG. 4(B), and obtained a reduced value of about $7 \times 10^2$ cm$^{-1}$.

Experiment 6

(reduction in the influence of defects by the addition of an impurity)

An attempt was made to form an inactive region by adding an impurity at the initial stage of the crystal growth and to use a high quality crystal layer grown thereon as an active region.

For the purpose of attaining good device characteristics by restraining the influences due to defects as much as possible, a region in the vicinity of the interface with an oxide film with numerous defects was deactivated by adding an impurity at the initial stage of the crystal growth, the introduction of the impurity was then terminated, followed by continuing the growth of a crystal on the impurity-containing region to thereby form a region with few defects. This region was used as an active layer.

Using a Sb-doped (100) silicon wafer ($\rho = 0.02\Omega$.cm), a substrate was prepared in the same manner as in Experiment 1. Crystal growth was performed while changing the crystal growing conditions in two stages as shown in Table 4 to thereby obtain a continuous polycrystal film as shown in FIG. 2(D) or FIG. 3(C). The cross section structure of the crystal grown was as shown in FIG. 4(D). On the surface of the polycrystal film was deposited a 200 Å thick Au film by means of vacuum evaporation to form a Schottky barrier, and there was measured a reverse saturation current. In comparison with that in the case where a polycrystal was grown under the conditions shown in Table 1 and a Schottky barrier was formed thereon in the same manner as in the above, the recombination current was found to be reduced. And there was obtained a current value lowered by about $10^2$ to $10^3$ holes with respect to each of the values of the a.

Thus, it was found that the influences due to defects in the vicinity of the SiO$_2$ interface can be reduced by changing the crystal growing conditions in two stages and introducing an impurity at the initial stage of the crystal growth.

Experiment 7

(reduction in the influence due to defects by the addition of an impurity and the use of Si$_3$N$_4$)

On the basis of the results obtained in Experiments 4 and 6, crystal growth was performed using Si$_3$N$_4$ as the insulating layer in the same manner as in Experiment 6 under the conditions shown in Table 4.

A Schottky barrier was formed on the surface of the continuous polycrystal film grown. And a reverse saturation current was measured. As a result, there was obtained a current value lowered by about 5 to 10 holes versus the characteristic obtained in Experiment 6.

Experiment 8

(formation of a solar cell)

The solar cell characteristics were evaluated using a low defect crystal thin film.

Using a Sb-doped (100) silicon wafer ($\rho = 0.02\Omega$.cm), a polycrystal silicon film comprising a lump composed of silicon monocrystalline regions having gaps was grown in the same manner as in Experiment 3.B was implanted into the surface thereof by means of ion implantation under the conditions of 20 KeV and $1 \times 10^{15}$ cm$^{-2}$, followed by annealing at 800° C. for 30 minutes, to thereby form a p$^+$ layer on the surface of the polycrystal. The solar cell of the constitution comprising p$^+$/polycrystal silicon/SiO$_2$/n$^+$ (100)Si thus obtained was subjected to measurement of I–V characteristics under irradiation of AM 1.5 (100 mW/cm$^2$) light. As a result, there were obtained 0.42 V as for the open circuit voltage, 22 mA/cm$^2$ as for the short circuit photocurrent and 0.67 as for the fill factor, and obtained a photoelectric conversion efficiency of 6.2% in the case of a=4 μm.

From the results obtained, it was found that a desirable solar cell can be prepared by using the polycrystal silicon thin film formed on the insulating layer as above described.

The present invention which has been accomplished based on the above experimental results relates to a process for the production of a solar cell comprising spacing part of an insulating layer formed on a silicon wafer, growing monocrystalline silicon regions at the opening by way of a selective epitaxial growing method, and removing a polycrystal thin film comprising lumps respectively composed of the monocrystals to thereby form a solar cell.

Figure 1:
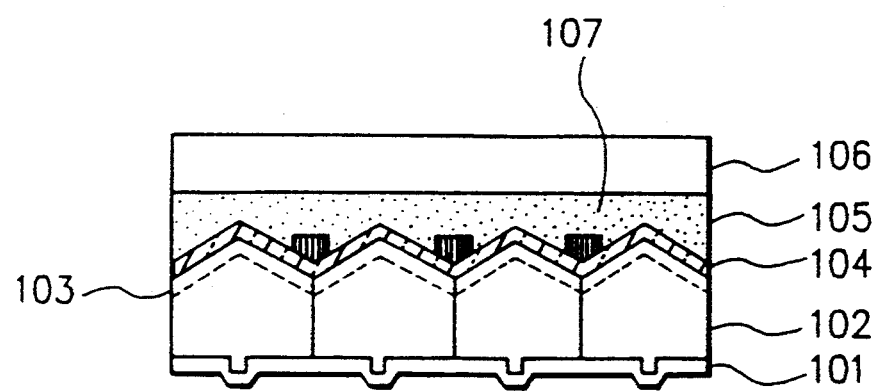
FIG. 1 is a schematic cross section view illustrating the constitution of a pn type solar cell produced according to the process of the present invention.

The constitution of the solar cell produced according to the method of the present invention is as shown in FIG. 1.

A p+ layer 103 is formed on the upper surface of a polycrystal silicon comprising a lump composed of silicon monocrystals 102. An epoxy resin (not shown) is embedded in gaps between the silicon single-crystallines 102. There are disposed a transparent electrode 104 capable of serving also as a reflection preventive film and a collecting electrode 107 on the p+ layer 103. The entire of the polycrystal silicon is fastened by a transparent substrate 106 made of glass or the like through an epoxy resin 105. A counter electrode 101 is formed on the lower surface of the polycrystal silicon.

In the following, explanation will be made of the process for the production of a solar cell according to the present invention, while referring to the process chart shown in FIG. 5.

Polycrystal silicon 503 comprising lumps respectively composed of silicon single-crystallines as shown in FIG. 2(D) is formed in the same manner as in Experiment 1, using a Sb-doped (100) silicon wafer ($\rho = 0.02 \Omega.cm$).

Figure 5A:
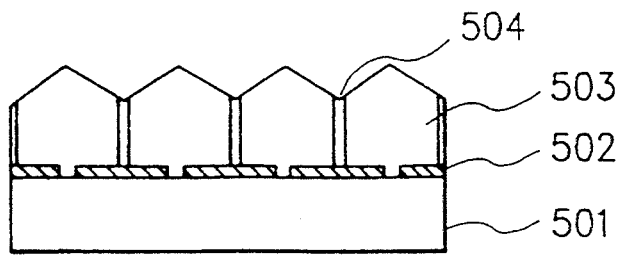
FIGS. 5(A)-5(H) are explanatory views of the production steps of the pn type solar cell shown in FIG. 1.

FIG. 2(D) is a cross section view taken along line B—B' in FIG. 3(C). In order to make it easy to understand, a cross section view taken along line A—A' in the figure is shown in FIGS. 5(A) through 5(H). FIG. 5(A) is a cross section view taken from the direction where gaps 504 can be seen in FIG. 2(D).

Figure 5B:
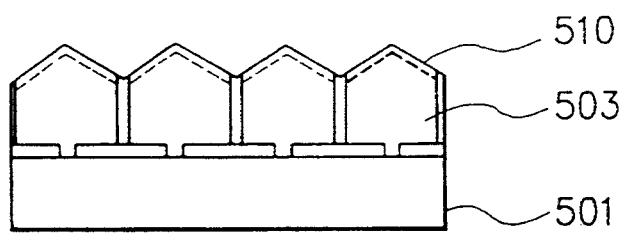
Figure 5C:
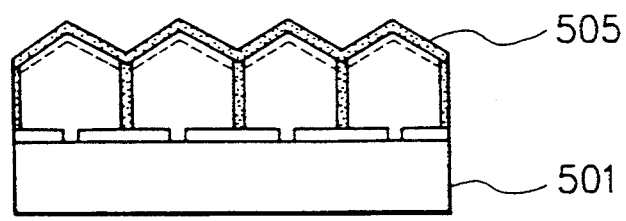
Figure 5D:
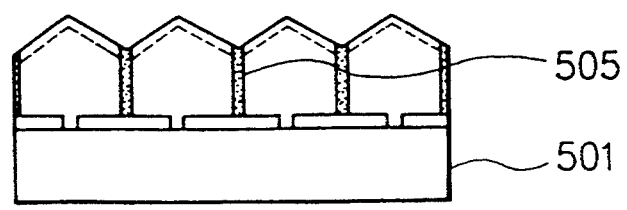

Then, after a p+ layer being formed on the surface thereof by means of ion implantation in the same manner as in Experiment 8, an oxide film 502 as the insulating layer is removed through the gaps by subjecting the film to etching treatment using an aqueous solution of HF (see, FIG. 5(B)), and an epoxy resin is applied on the surface of the polycrystal to fill the gaps up with the resin (see, FIG. 5(C)). After the resin being cured, only the resin situated on the surface of the polycrystal is removed by means of plasma etching while leaving the resin embedded in the gaps (see, FIG. 5(D)). On the exposed surface of the polycrystal are deposited a transparent electrode 506 then a collecting electrode 507 (see, FIG. 5(E)). Successively, an epoxy resin 511 is again applied thereon and the surface of the polycrystal is fastened using a substrate 508 such as a glass plate or the like (see, FIG. 5(F)). After the resin being cured, the polycrystal silicon layer 503 is separated from the silicon wafer 501, and the residual oxide film on the reverse side face of the polycrystal silicon is completely removed again using an aqueous solution of HF (see, FIG. 5(G)). An electrode 509 is deposited on the reverse side face of the polycrystal silicon layer 503, whereby the process is completed (see, FIG. 5(H)).

As the insulating layer of the solar cell according to the present invention, there is used a material which is inferior to silicon with respect to crystalline nucleus-forming density thereon, in order to prevent generation of a crystalline nucleus during the selective crystal growth. Such material can include, for example, $SiO_2$, $Si_3N_4$, etc.

As the raw material gas for selectively growing a crystal which is used in the present invention, there can be mentioned, for example, silanes such as $SiH_2Cl_2$, $SiCl_4$, $SiHCl_3$, $SiH_4$, $Si_2H_6$, $SiH_2F_2$, $Si_2F_6$, etc., and halogenated silanes.

In addition to the above raw material gas, there is added $H_2$ as a carrier gas or in order to provide a reducing atmosphere capable of promoting crystal growth.

The ratio of the amount of the raw material gas to the hydrogen gas should be properly determined depending upon the formation method, the kind of the raw material gas, the kind of the constituent material of the insulating layer, or/and the forming conditions. However, in general, it is, in terms of the flow ratio, preferably 1:10 to 1000, or more preferably in the range of 1:20 to 1:800.

In the present invention, HCl is used in order to prevent a crystalline nucleus from generating on the insulating layer. The amount of the HCl to be added to the raw material gas should be properly determined depending upon the formation method, the kind of the raw material gas, the kind of the constituent material of the insulating layer, or/and the forming conditions. However, in general, the ratio of 1:0.1 to 1:100 is desirable, and the ratio of 1:0.2 to 1:80 is more desirable.

As for the temperature and the pressure at which the selective crystal growth is performed in the present invention, each of them is different depending upon the formation method, the kind of the raw material gas, or/and the forming conditions including the flow ratio among the raw material gas, $H_2$ and HCl. However, in general, as for the temperature, it is desired to be controlled preferably in the range of 600° C. to 1250° C. or more preferably in the range of 650° C. to 1200° C. in the case of using a conventional low pressure CVD method. Especially, in the case where the insulating layer composed of $SiO_2$ is used, it is desired to be in the range of 850° C. to 950° C. in order to prevent occurrence of defects at the initial stage of the crystal growth and to maintain a desired crystal growing rate.

As for the pressure, it is desired to be preferably in the range of $10^{-2}$ to 760 Torr or more preferably in the range of $10^{-1}$ to 760 Torr.

As the substrate used in the solar cell according to the present invention which serves to fasten the polycrystal thin film, there is used a light transmissive material. As such material, there can be mentioned, for example, films or sheets of glass, $SiO_2$, ceramics, or synthetic resins such as polyimide, polycarbonate, polyamide, etc.

As the resin to be used for filling the gaps among the single-crystallines in the present invention, it is desired to selectively use one or more resins having a heat resistance, an electrically insulating property, a mechanical strength, a dimensional stability, a corrosion resistance and a weather resistance. Among such resins, curable resins which are in liquid state and are capable of being cured upon the application of heat, ultraviolet rays or electron beam are most desirable. As such resins, there can be mentioned, for example, epoxy resin, diglycol dialkylcarbonate resin, polyimide resin, melamine resin, phenol resin, urea resin, etc.

In the following, explanation will be made of an example of the manner of injecting a resin wherein an epoxy resin is used as the resin. It should be understood that the resin used in the present invention is not limited only to the epoxy resin.

Figure 8:
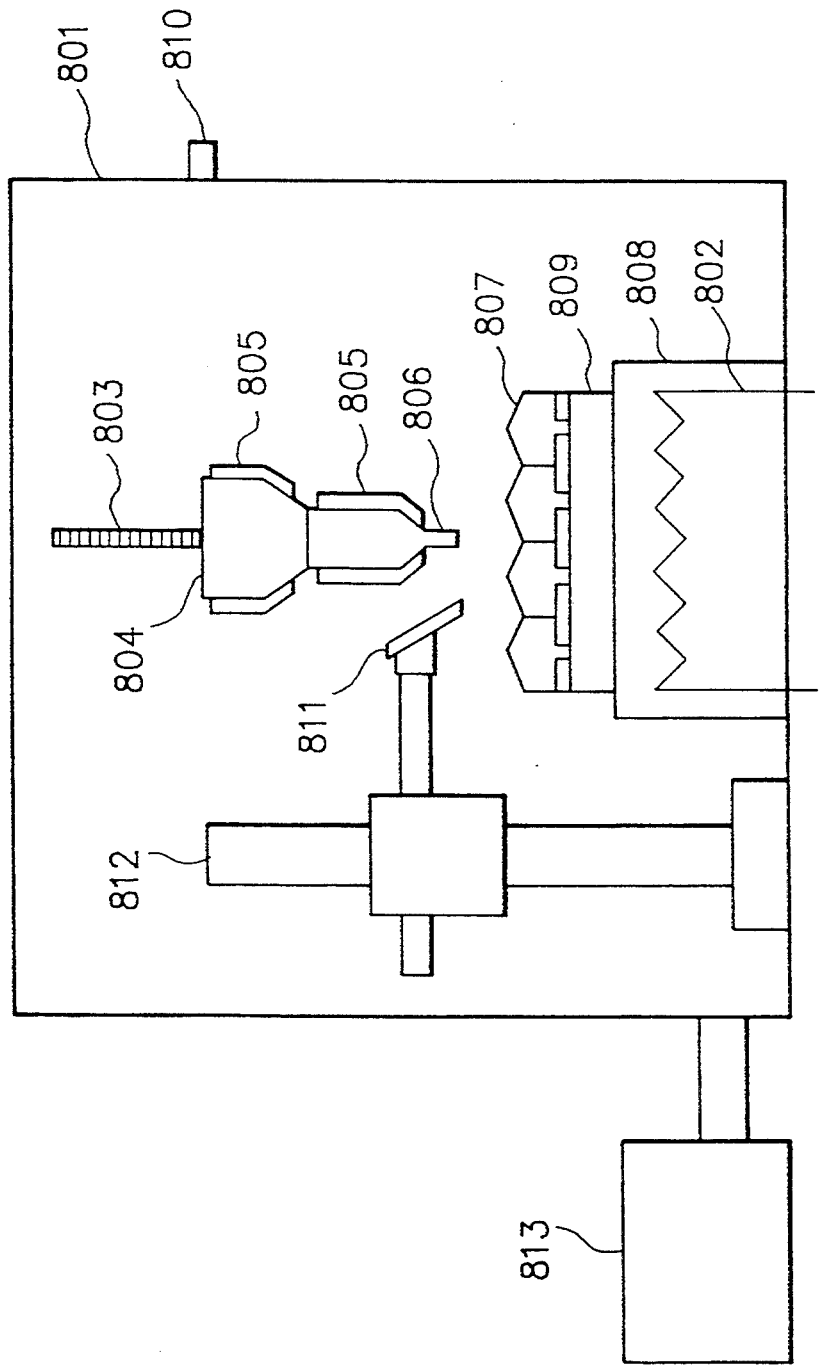
FIG. 8 is a schematic diagram of an apparatus for conducting injection molding of a resin.

As the epoxy resin, there is used a novolak type epoxy resin EPICOTE 154 (trademark name, product by YUKASHELL EPOXY Kabushiki Kaisha). After this resin being mixed with a curing agent comprising polyvalent solid acid anhydride YH-308H (trademark name, product by YUKASHELL EPOXY Kabushiki Kaisha) and a reactive diluent comprising alkylmonoglycidyl ether BGE (trademark name, product by YUKASHELL EPOXY Kabushiki Kaisha), injection of the resultant is carried out under reduced pressure. The apparatus shown in FIG. 8 comprises a resin-injecting nozzle 806 disposed in a treating vessel capable of being evacuated to reduced pressure and makes it possible to perform injection molding of a resin under reduced pressure. The resin-injecting nozzle 806 has the structure similar to that in a conventional injection molding machine and it is so designed that it can move together with a resin container 804 on a rail 803. The nozzle 806 and the resin container 804 are provided with a common thermostatic heater 805 which serves to maintain the resin at a desired temperature. The apparatus shown in the figure is provided with a squeegee moving means 812 for moving a squeegee (blade) 811 in order to spread the resin applied on the crystal.

In order to perform injection molding of a resin using the above apparatus, a substrate 809 having a single crystal grown thereon is introduced into a vacuum vessel 801, it is set to a supporting table 808, and the temperature generated by a heater 802 installed in the supporting table 808 is set to 100° C. Successively, the temperature of the thermostatic heater 805 is set to 100° C. A mixture composed of the epoxy resin EPICOTE 154, the curing agent YH-308 and the reactive diluent BGE with a mixing ratio in terms of weight ratio of 100:70:20 was introduced into the resin container 804, followed by allowing to stand. The vacuum vessel 801 is then evacuated to bring the inside to a vacuum of $10^{-3}$ Torr by using a vacuum pump 813. After the resin being uniformly dispersed in the resin container 804, the resin is discharged through the nozzle 806, wherein the resin is spread using the squeegee moving means 812 such that the resin is uniformly distributed over the crystal 807 at a thickness of about 1 μm. After the resin being spread as desired, a pressure control valve 810 is gradually opened to bring the inside of the vacuum vessel 801 to atmospheric pressure, followed by allowing to stand for 5 hours while maintaining the temperature of the heater 802 at 100° C. Thereafter, the temperature of the heater 802 is elevated to 200° C., followed by allowing to stand for 6 hours. Then, the substrate 809 is taken out from the vacuum vessel 801. When a man touches the resin formed on the single crystal, it is understood that the resin is solidified.

The monocrystalline silicon regions constituting the polycrystal thin film to be formed according to the present invention are capable of forming a junction by doping them with an impurity either during their crystal growth or after their formation. As the impurity element to be used in this case, there can be mentioned elements belonging to the group IIIA of the periodic table as the p-type impurity such as B, Al, Ga, In, etc, and elements belonging to the group VA of the periodic table as the n-type impurity such as P, As, Sb, Bi, etc., and among these elements, B, Ga, P and Sb being most appropriate. The amount of these impurities to be incorporated should be properly determined depending upon the electric characteristics as required. As for the substance containing such impurity element as its constituent, it is desired to selectively use those compounds which are gaseous at normal temperature under normal pressure or can be easily gasified by an appropriate gasifying device.

As such compound, there can be mentioned $PH_3$, $P_2H_4$, $PF_3$, $PF_5$, $PCl_3$, $AsH_3$, $AsF_3$, $AsF_5$, $AsCl_3$, $SbH_3$, $SbF_5$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. These impurity element-containing compounds may be used either singly or in combination of two or more of them.

There is not any particular restriction for the shape of the spaced portion to be formed at the insulating layer at the time of performing selective crystal growth upon practicing the process for the production of a solar cell according to the present invention, but it is desired to be in the form of a square form or a round form. As for the size of the opening, since there is a tendency that the facet of the angular lump composed of monocrystalline silicon regions is deformed or the crystallinity of those monocrystalline silicon regions becomes worse as the size of the opening is enlarged as described in Experiment 1, it is desired to be on the order of several microns or smaller in order not only to prevent the facet from being deformed but also to facilitate the removal thereof. Particularly, since the situation depends upon the patterning accuracy by photolithography, the value of the a is desired to be in the range of 1 μm to 5 μm in the case where the shape is in the form of a square. As for the interval b at which the openings are formed, it is desired to be controlled in the range of 10 μm to 200 μm so that the irregularity at the surface of the polycrystal silicon lies in the range of 2 μm to 40 μm, while having a due care about light reflectance and the facility of forming the electrode at the angular facet.

There is not any particular restriction for the layer constitution of the solar cell to be produced according to the process of the present invention. The process of the present invention can be applied in the production of a solar cell of any layer constitution of Schottky type, MIS type, pn junction type, pin junction type, heterojunction type, or tandem type.

In the following, explanation will be made of the production of a solar cell in accordance with the process of the present invention with reference to examples, which are not intended to restrict the scope of the invention.

EXAMPLE 1

Figure 5E:
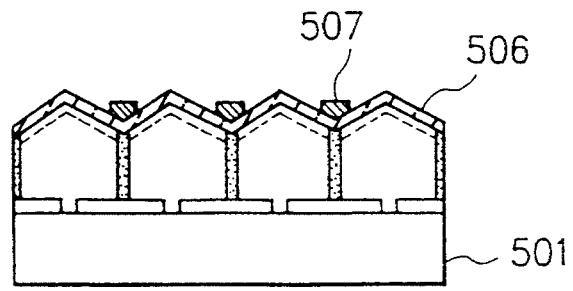
Figure 5F:
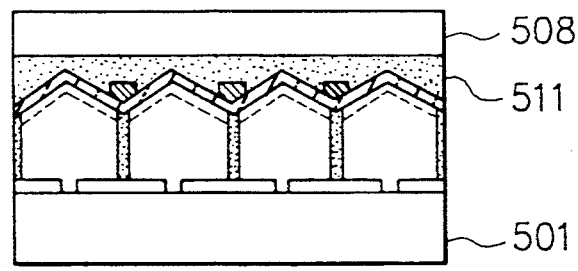
Figure 5G:
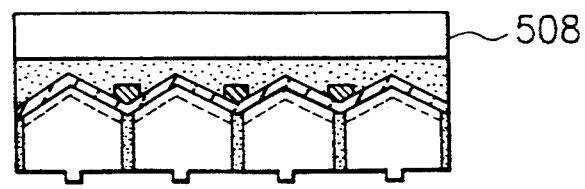
Figure 5H:
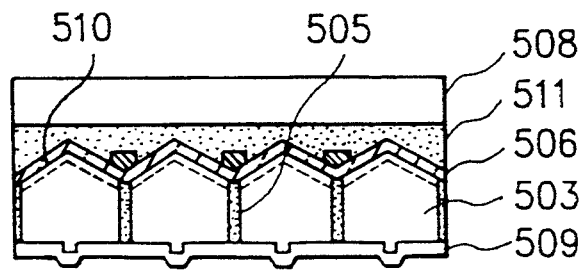
Figure 6A:
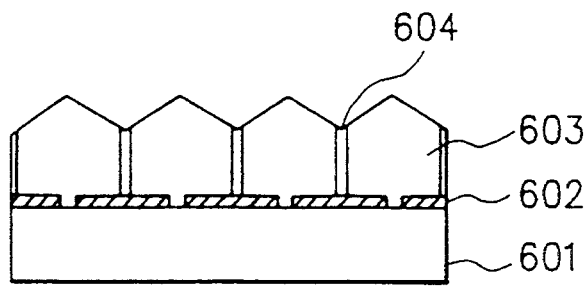
FIGS. 6(A)-6(H) are explanatory views of the production steps of a hetero type solar cell to be produced according the process of the present invention.
Figure 6B:
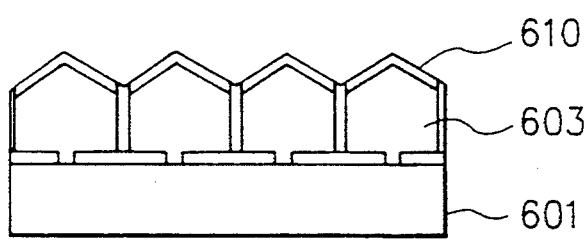
Figure 6C:
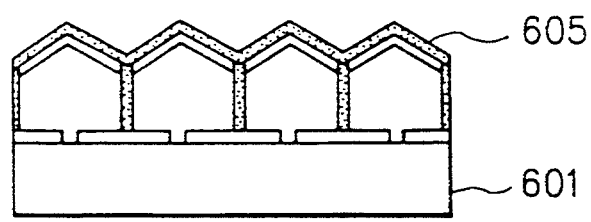
Figure 6D:
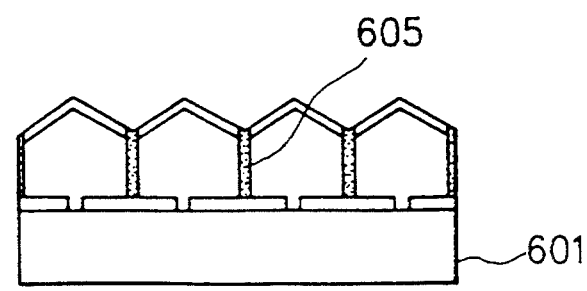
Figure 6E:
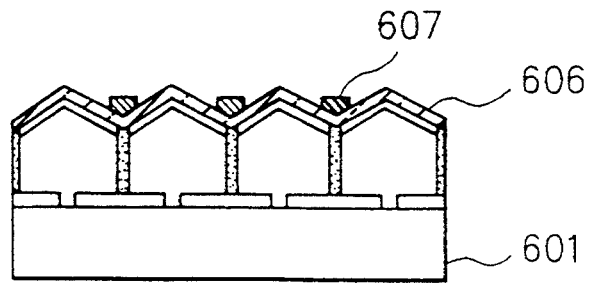
Figure 6F:
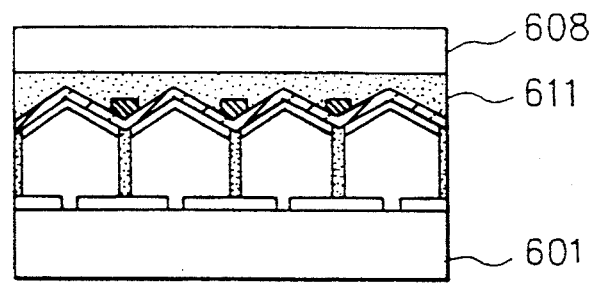
Figure 6G:
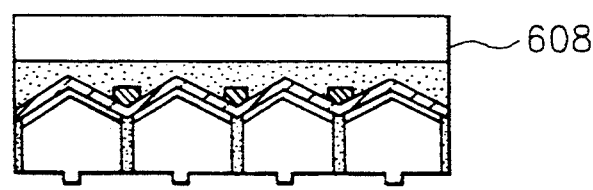
Figure 6H:
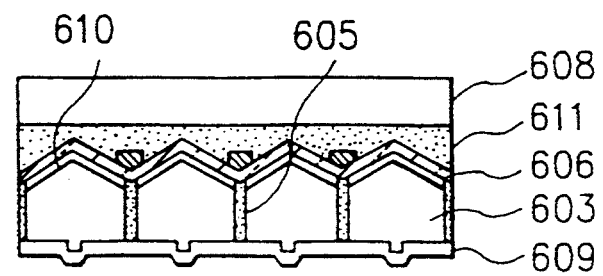

There was prepared a pn junction type solar cell comprising lumps respectively composed of silicon monocrystalline silicon regions having such a regular crystal orientation as shown in FIG. 1 or FIG. 5(H) in the same manner as in the foregoing Experiment 3. The production process thereof is illustrated in FIG. 5(A) through FIG. 5(H).

As the base member, there was used a P-doped (100) silicon wafer ($\rho = 0.05 \Omega \cdot cm$). Instead of the thermally oxidized film, there was deposited a film comprising PSG (2000 Å) as the insulating layer 502. Three kinds of square spaced portions with a different edge a being 1.2 μm, 2 μm and 4 μm were formed at an interval b of 50 μm, followed by performing selective crystal growth under the conditions shown in Table 3 using a conventional low pressure CVD apparatus, whereby forming a polycrystal silicon thin film comprising lumps respectively composed of silicon monocrystalline silicon regions respectively having a regular crystal orientation as shown in FIG. 3(C) on the silicon wafer (see, FIG. 5(A)).

In the above, P was thermally diffused from the PSG, wherein an n+ layer was formed on the reverse side face of the polycrystal silicon (not shown in the figure).

Following the procedures of Experiment 8, B was implanted into the surface of the polycrystal silicon by means of an ion implantation technique under the conditions of 20 KeV and $1 \times 10^{15}$ cm$^{-2}$, followed by annealing at 800° C. for 30 minutes, whereby a p+ layer was formed on the surface of the polycrystal silicon.

At the time of performing the ion implantation in the above, the ion implantation was conducted to the base member at an angle shifted by some degrees from the vertical direction so that no ion was reached to the peripheral crystal in contact with the insulating layer in each of the gaps formed among the monocrystalline silicon regions (by this, at the time of forming a counter electrode, a leakage can prevented from occurring at the junction portion).

Then, the wafer was immersed in an aqueous solution of HF with a concentration of 49% for 24 hours, wherein the PSG 502 was etched off through the gaps 504 of about 8 μm in size, followed by washing with water and drying. Then, an epoxy resin 505 was applied over the surface of the polycrystal to embed the gaps 504. As the epoxy resin, there was used a novolak type epoxy resin EPICOTE 154 (trademark name, product by YUKASHELL EPOXY Kabushiki Kaisha). This resin was mixed with a curing agent comprising polyvalent solid acid anhydride YH-308H (trademark name, product by YUKASHELL EPOXY Kabushiki Kaisha) and a reactive diluent comprising alkylmonoglycidyl ether BGE (trademark name, product by YUKA-SHELL EPOXY Kabushiki Kaisha) at a mixing ratio in terms of weight ratio of 100:70:20. Using this mixture, resin injection molding was performed under reduced pressure. The resin injection molding was performed using the apparatus shown in FIG. 8, wherein the resin was discharged over the surface of the polycrystal through the resin injection nozzle 806 while uniformly spreading the resin by means of the squeegee 811. The resin was cured at 100° C. for 5 hours, followed by subjecting the resultant to $O_2$ plasma etching (the flow rate of the $O_2$: 500 sccm/min., pressure: 1 Torr, and high frequency discharging power: 200 W) to thereby expose the entire surface of the polycrystal while leaving the resins embedded in the gaps. Thereafter, those resins were cured at a temperature of 250° C. for 3 hours (see, FIG. 5(B) through FIG. 5(D)).

On the entire surface of the polycrystal was deposited a transparent and conductive film 506 comprising ITO by means of electron beam evaporation, and successively a Cr film as the collecting electrode 506 was deposited at a thickness of 1 μm thereon by means of vacuum evaporation (see, FIG. 5(E)). An epoxy resin 511 was again applied over the surface of the collecting electrode in the same manner as in the above, and a glass plate as the substrate 508 was placed on the resin applied to thereby fasten the entire of the polycrystal silicon film, followed by curing the resin. Thereafter, the polycrystal silicon layer comprising lumps respectively composed of monocrystals was separated from the silicon wafer, and the residual PSG on the reverse side face thereof was etched off using an aqueous solution of HF with a concentration of 10%. Finally, on the reverse side face of the polycrystal silicon layer was deposited a Cr film as the counter electrode at a thickness of 3000 Å by means of vacuum evaporation (see, FIG. 5(F) through FIG. 5(H)).

As for the pn junction type solar cell thus obtained, its I-V characteristics were observed under irradiation of AM 1.5 light. The cell area in this case was 0.16 cm².

The characteristics obtained in the above were compared with those obtained for the solar cell prepared in the same manner as in the above, except for using a polycrystal silicon film obtained by performing crystal growth for 90 minutes under the conditions shown in Table 1. The results obtained were as shown in Table 5.

It is understood that the characteristics provided by the polycrystal solar cell prepared by the present invention which performs the two step crystal growth are surpassing those provided by the polycrystal solar cell prepared at a single substrate temperature of 1030° C. As for the reason of the tendency that the characteristics are reduced as the value of the a is enlarged, it is considered that deformation of the facet is caused at the time of crystal growth and because of this, the crystallinity is reduced to increase defect level.

EXAMPLE 2

There was prepared a heterojunction type solar cell of amorphous silicon carbide/polycrystal silicon in the same manner as in Example 1. As the base member, there was used a P-doped (100) silicon wafer ($\rho=0.05\Omega.cm$). A PSG film was deposited thereon at a thickness by a conventional normal pressure CVD method. Square spaced portions with a uniform edge a being 1.2 μm were formed at an interval b of 30 μm. Selective crystal growth was performed under the conditions shown in Table 6 by means of a conventional low pressure CVD method to thereby form a polycrystal silicon thin film comprising lumps respectively composed of silicon single-crystallines with a regular crystal orientation. The gaps remained among the monocrystals were of about 6 μm in size.

FIG. 6(A) through FIG. 6(H) are of the production process of the heterojunction solar cell prepared (which is almost the same as in the case of FIG. 5 described in Example 1, except that instead of the p+ layer 510, a p-type amorphous silicon carbide 610 was formed on the polycrystal silicon in the step (B)).

The p-type amorphous silicon carbide layer 610 was formed on the surface of the polycrystal silicon at a thickness of 100 Å under the conditions shown in Table 7 using a conventional plasma CVD apparatus. The amorphous silicon carbide film formed here was found to be of about $10^{-2}$ S.cm$^{-1}$ in dark conductivity, and the composition ratio of C to Si was 2:3.

As the transparent and conductive film 606, an ITO film was deposited at a thickness of about 1000 Å by means of electron beam evaporation, and as the collecting electrode 607, a Cr film was deposited at a thickness of 1 μm by means of vacuum evaporation.

The amorphous silicon carbide/polycrystal silicon heterojunction type solar cell thus obtained was evaluated with respect to the I-V characteristics under irradiation of AM 1.5 light (the cell area: 0.16 cm²). As a result, there were obtained satisfactory results, particularly, 0.52 V for the open circuit voltage, 20 mA/cm² for the short circuit photocurrent, 0.56 for the fill factor, and 5.8% for the photoelectric conversion efficiency. From the results obtained, it was found that the solar cell is not inferior to the known amorphous silicon carbide/single crystal silicon heterojunction type solar cell.

EXAMPLE 3

Figure 9A:
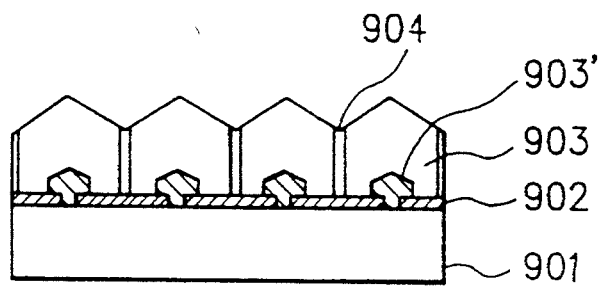
FIGS. 9(A)-9(H) and 10(A)-10(H) are explanatory views respectively of the production steps of a pn or pin type solar cell to be produced according to the process of the present invention.
Figure 9B:
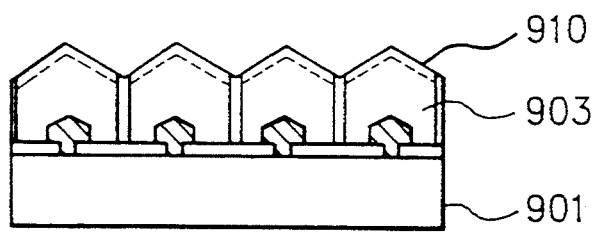
Figure 9C:
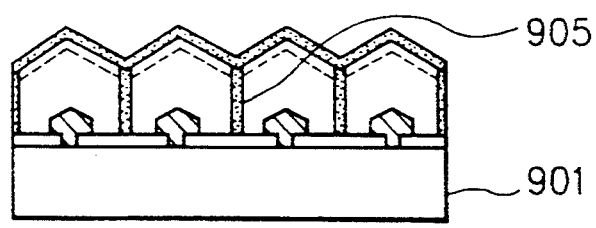
Figure 9D:
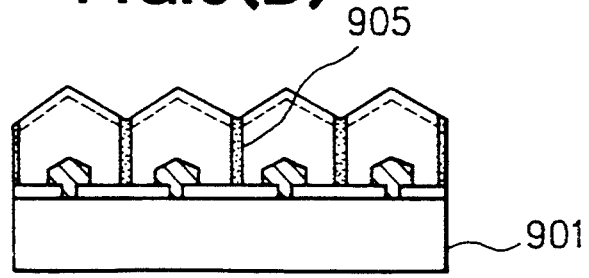
Figure 9E:
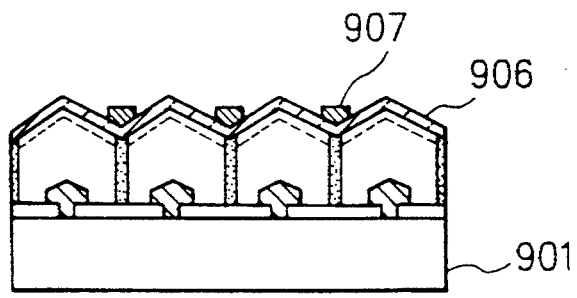
Figure 9F:
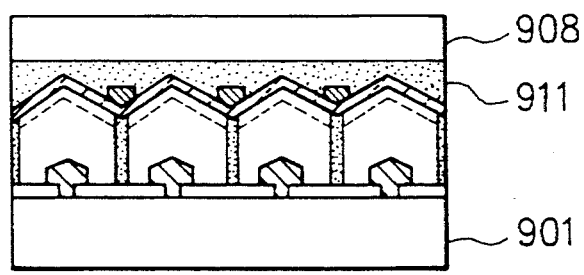
Figure 9G:
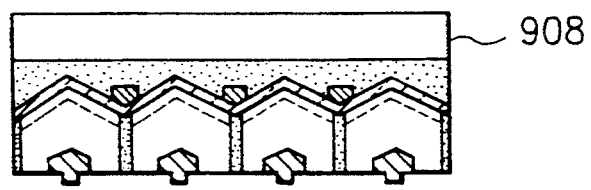
Figure 9H:
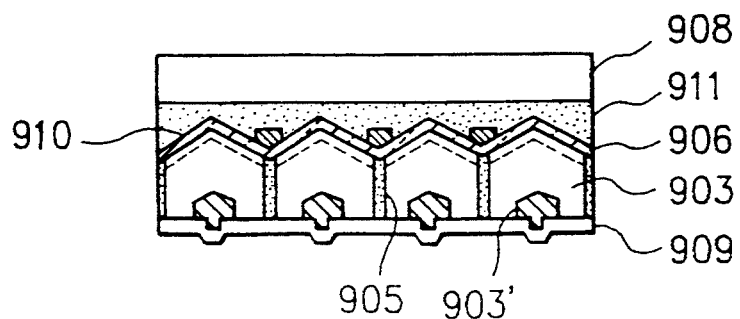

There was prepared a pn junction type solar cell with the addition of an impurity in a region in the vicinity of the interface as shown in FIG. 9(H) in the same manner as in Examples 1 and 2.

FIG. 9(A) through FIG. 9(H) illustrate the production process thereof.

As the base member, 901 there was used a P-doped (100) silicon wafer ($\rho=0.05\Omega\cdot cm$). As the insulating layer 902, there was used a thermally oxidized film (1000 Å in thickness). Square spaced portions with a uniform edge a being 1.2 μm were formed at an interval b of 50 μm. Selective crystal growth was performed under the conditions shown in Table 8 using a conventional low pressure CVD apparatus shown in FIG. 7 to thereby form a polycrystal silicon thin film comprising lumps respectively composed of silicon monocrystalline regions 903 with a regular crystal orientation as shown in FIG. 3(C)(see, FIG. 9(A)). The remaining steps were conducted following the procedures of Example 1, to thereby obtain a release type solar cell with a pn junction.

The pn junction type solar cell thus obtained was evaluated with respect to the I–V characteristics under irradiation of AM 1.5 light at 0.16 cm² in cell area. As a result, there were obtained 0.47 V for the open circuit voltage, 24 mA/cm² for the short circuit photocurrent, 0.71 for the fill factor, and 8% for the photoelectric conversion efficiency. It was found that the solar cell provides improved characteristics superior to those provided in the case of the solar cell with no addition of an impurity at the initial stage of the crystal growth (Example 1).

EXAMPLE 4

Figure 10A:
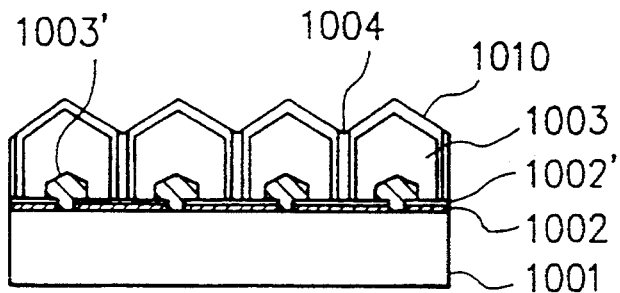
Figure 10B:
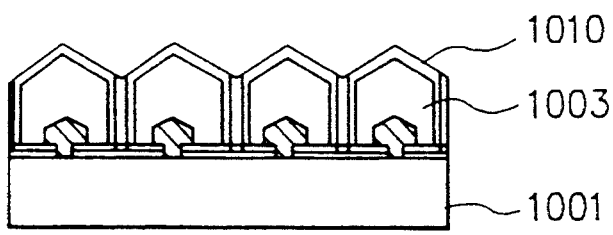
Figure 10C:
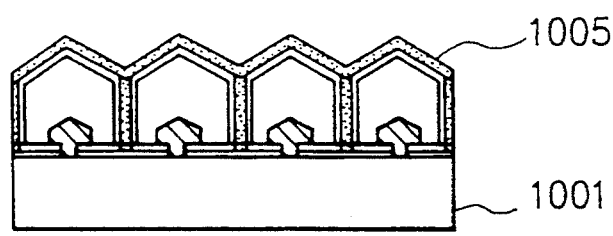
Figure 10D:
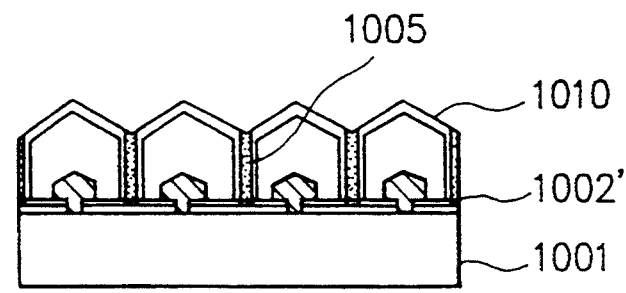
Figure 10E:
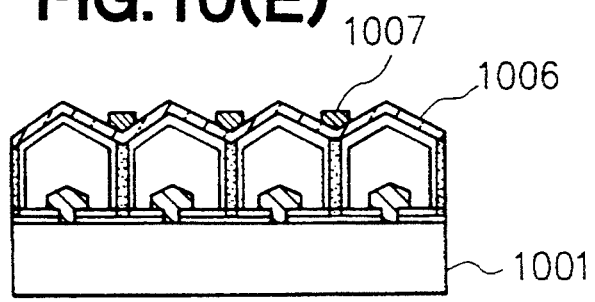
Figure 10F:
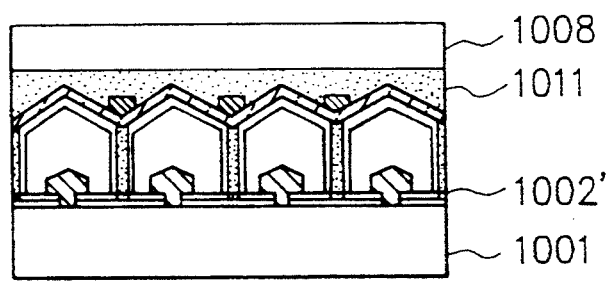
Figure 10G:
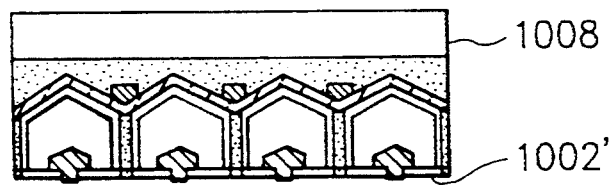
Figure 10H:
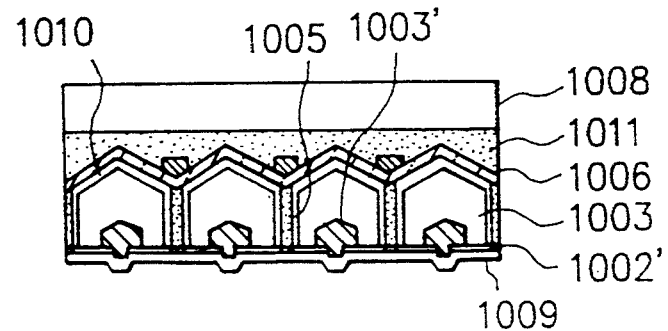

There was prepared a pin junction type solar cell as shown in FIG. 10(H) in the same manner as in Examples 1, 2 and 3. The solar cell shown in FIG. 10 is of the structure in which a pin junction is established within the monocrystalline silicon regions by incorporating an impurity into the raw material gas during the selective crystal growth.

The important point herein is that since the end face of p/i junction in the portions where gaps are to be generated is situated on an insulating layer 1002, when the insulating layer is removed by means of etching in order to separate the polycrystal obtained from the wafer, the junction end face becomes exposed, and because of this, the successive steps (electrical insulation, isolation and the like upon forming the reverse electrode) becomes complicated. In view of this, as shown in FIG. 10(A), the insulating layer was made to be of a two-layered structure comprising base member 1001/SiO₂ 1002/Si₃N₄ 1002'. Then, minute spaced portions were formed at the insulating layer by means of a conventional reactive ion etching method, followed by forming a polycrystal film by a selective crystal growing process.

In the above, the $SiO_2$ was deposited at a thickness of 1000 Å by means of a normal pressure CVD method, and the $Si_3N_4$ was deposited at a thickness of 3000 Å by means of a low pressure CVD method. The openings were made to be of a size with a being 1.2 μm and they were arranged at an interval b of 50 μm. Monocrystalline silicon regions were formed by a selective crystal growing method while introducing a different impurity with a different flow rate such that n-type conduction, i-type conduction and p-type conduction were established in this order from the side of the base member. The crystal growing conditions in this case were shown in Table 9.

The switching of the impurity was performed as follows. $PH_3$ was introduced until the growing monocrystalline silicon regions became about 10 μm thick to thereby form an n-type layer; the introduction of the $PH_3$ was terminated, and when the monocrystalline silicon regions collided with each other wherein gaps of about 6 μm in size were formed. $B_2H_4$ was then introduced to thereby form a p-type layer at a thickness of about 200 Å on the surface of the crystal.

Using the polycrystal thin film thus formed, a solar cell with a pin junction was prepared following the process steps shown in FIG. 10(A) through FIG. 10(H).

As above described, the insulating layer was two-layered. The $Si_3N_4$ was etched off through gaps 1004 by means of reactive ion etching, followed by immersing the resultant in an aqueous solution of HF with a concentration of 49% to thereby remove the $SiO_2$ layer 1002. In this case, the end face of the pin junction is protected by the $Si_3N_4$ layer. After removal thereof, the n-type layer 1003' has a projected extremity, and because of this, the connection of a counter electrode can be easily carried out.

The remaining steps other than those above described were conducted in the same manner as in Examples 1 and 2.

The pin junction type solar cell thus obtained was evaluated with respect to the I–V characteristics under irradiation of AM 1.5 light at 0.16 cm² in cell area. As a result, there were obtained satisfactory results, particularly, 0.47 V for the open circuit voltage, 24 mA/cm² for the short circuit photocurrent, 0.71 for the fill factor, and 8% for the photoelectric conversion efficiency.

As apparent from what above described, the process for the production of a polycrystal solar cell according to the present invention makes it possible to produce a high quality thin solar cell while decreasing generation of defects in the crystal as grown in the vicinity of the interface between the crystal as grown and the insulating layer during selective crystal growth.

In addition, a relatively inexpensive solar cell can be mass-produced, since the wafer can be repeatedly reused because the resulting polycrystal thin film is separated from the wafer utilizing the gaps remaining among the monocrystalline silicon regions to constitute the film and the film is fastened using a substrate made of glass or the like.

TABLE 1

| gas flow rate (l/min) | substrate temperature (°C.) | inner pressure (Torr) | growth period (min) |
| --- | --- | --- | --- |
| SiH₂Cl₂/HCl/H₂ = 0.53/2/100 | 1030 | 80 | 20 |

TABLE 2

| a (μm) | 1.2 | 2 | 4 |
| --- | --- | --- | --- |
| facet rate (%) | 96.4 | 93.1 | 84.6 |

TABLE 3

| SiH₂Cl₂/HCl/H₂ (l/min) | substrate temperature (°C.) | inner pressure (Torr) | growth period (min) |
| --- | --- | --- | --- |
| 0.53/2/100 | 950 | 100 | 40 |
| 0.53/2/100 | 1060 | 100 | 80 |

TABLE 4

| SiH₂Cl₂/PH₃/HCl/H₂ (l/min) | substrate temperature (°C.) | inner pressure (Torr) | growth period (min) |
| --- | --- | --- | --- |
| 0.53/3.2 × 10⁻³/2.0/100 | 1060 | 100 | 10 |

TABLE 4-continued

| SiH$_2$Cl$_2$/PH$_3$/HCl/H$_2$ (1/min) | substrate temperature (°C.) | inner pressure (Torr) | growth period (min) |
|---|---|---|---|
| 0.53/0/2.0/100 | 1060 | 100 | 60 |

TABLE 5

| a (μm) | 1.2 | 2 | 4 |
|---|---|---|---|
| conversion efficiency (%) 950 → 1060° C. | 7.6 | 7.3 | 7.1 |
| conversion efficiency (%) 1030° C. | 4.5 | 4.1 | 4 |

TABLE 6

| gas flow rate (1/min) | substrate temperature (°C.) | inner pressure (Torr) | growth period (min) |
|---|---|---|---|
| SiH$_2$Cl$_2$/HCl/H$_2$ = 0.53/2.0/100 | 950 | 100 | 20 |
| ↓ | ↓ | ↓ | ↓ |
| 0.53/1.6/100 | 950 | 950 | 40 |
| ↓ | ↓ | ↓ | ↓ |
| 0.53/2.0/100 | 1060 | 1060 | 80 |

TABLE 7

| gas flow rate (1/min) | substrate temperature (°C.) | inner pressure (Torr) | electrical discharge (W) |
|---|---|---|---|
| SiH$_2$/CH$_4$ = 0.8 cc/0.2 cc B$_2$H$_6$/SiH$_4$ = 1.5 × 10$^{-2}$ | 350 | 0.5 | 8 |

TABLE 8

| SiH$_2$Cl$_2$/PH$_3$/HCl/H$_2$ (1/min) | substrate temperature (°C.) | inner pressure (Torr) | growth period (min) |
|---|---|---|---|
| 0.53/3.2 × 10$^{-3}$/2.0/100 | 950 | 100 | 30 |
| 0.53/0/2.0/100 | 1060 | 100 | 85 |

TABLE 9

| | SiH$_2$Cl$_2$ (1/min) | HCl (1/min) | H$_2$ (1/min) | PH$_3$ SiH$_2$Cl$_2$ (ppm) | B$_2$H$_6$ SiH$_2$Cl$_2$ (ppm) | substrate temperature (°C.) | reaction pressure (Torr) |
|---|---|---|---|---|---|---|---|
| p$^+$ Si layer | 0.6 | 2 | 100 | 0 | 4000 | 1030 | 80 |
| i Si layer | 0.53 | 2 | 100 | 0 | 0 | 1060 | 120 |
| n$^+$ Si layer | 0.53 | 2 | 100 | 6000 | 0 | 950 | 100 |

We claim:

1. A process for the production of a solar cell said process comprising the steps of:
   (i) forming an insulating layer on a silicon wafer,
   (ii) forming laterally spaced openings in which a surface of the silicon wafer is exposed,
   (iii) performing crystal growth of monocrystalline silicon regions at the openings which laterally extend over a surface of the insulating layer until the monocrystalline silicon regions collide with each other,
   (iv) removing at least the exposed portions of the insulating layer through gaps left among the monocrystalline silicon regions,
   (v) embedding a resin in the gaps,
   (vi) forming an electrode over the surfaces of the monocrystalline silicon regions and fastening the surface of the electrode to a substrate through an adhesive resin,
   (vii) separating the monocrystalline silicon regions from the silicon wafer, and
   (viii) disposing a counter electrode to another surface of the monocrystalline silicon regions.

2. A process for the production of a solar cell according to claim 1, wherein the monocrystals after growth have a region where the number of plane defects in the horizontal direction in the vicinity of the interface with the insulating layer is less than $1 \times 10^4$ cm$^{-1}$ at the periphery of the spaced opening.

3. A process for the production of a solar cell according to claim 1, wherein the growth is performed by means of a CVD process while stepwise changing the substrate temperature.

4. A process for the production of a solar cell according to claim 1, wherein the insulating layer is composed of Si$_3$N$_4$.

5. A process for the production of a solar cell according to claim 1, wherein an impurity is added at the initial stage of crystal growth in the step of growing the monocrystalline silicon regions.

6. A process for the production of a solar cell, said process comprising the steps of:
   (i) forming an insulating layer of Si$_3$N$_4$ on a silicon wafer,
   (ii) forming laterally spaced openings in which a surface of the silicon wafer is exposed,
   (iii) performing crystal growth of monocrystalline silicon regions at the openings which laterally extend over a surface of the insulating layer until the monocrystalline silicon regions collide with each other, by means of a CVD process while stepwise changing the substrate temperature,
   (iv) removing at least the exposed portions of the insulating layer through gaps left among the monocrystalline silicon regions,
   (v) embedding a resin in the gaps,
   (vi) forming an electrode over the surfaces of the monocrystalline silicon regions and fastening the surface of the electrode to a substrate through an adhesive resin,
   (vii) separating the monocrystalline silicon regions from the silicon wafer, and
   (viii) disposing a counter electrode to another surface of the monocrystalline silicon regions.

7. A process for the production of a solar cell according to claim 6, wherein an impurity is added at the initial stage of crystal growth in the step of growing the monocrystalline silicon regions.

* * * * *

UNITED STATES PATENT AND TRADEMARK OFFICE
CERTIFICATE OF CORRECTION

PATENT NO. : 5,403,751
DATED : April 4, 1995
INVENTOR(S) : SHOJI NISHIDA, ET AL.

It is certified that error appears in the above-identified patent and that said Letters Patent is hereby corrected as shown below:

ON TITLE PAGE

In [56] References Cited, under FOREIGN PATENT DOCUMENTS:
"58-56330  4/1983  Japan" should read
--58-56320  4/1983  Japan--.

COLUMN 3

Line 10, "angular" should read --monocrystalline silicon regions--.
Line 11, "single-crystallines" should be deleted.
Line 25, "invention," should read --invention;--.
Line 27, "method," should read --method;--.
Line 31, "grown," should read --grown;--.
Line 34, "invention," should read --invention;--.
Line 36, "FIG, 1." should read --FIG. 1;--.
Line 39, "invention." should read --invention;--.
Line 41, "apparatus," should read --apparatus;--.
Line 43, "resin," should read --resin;--.
Line 47, "invention," should read --invention.--.

COLUMN 5

Line 68, "single crystallines" should read --monocrystals--.

COLUMN 7

Line 22, "resultant" should read --results--.

COLUMN 8

Line 65, "opening" should read --openings--.

UNITED STATES PATENT AND TRADEMARK OFFICE
CERTIFICATE OF CORRECTION

PATENT NO. : 5,403,751
DATED : April 4, 1995
INVENTOR(S) : SHOJI NISHIDA, ET AL.

It is certified that error appears in the above-identified patent and that said Letters Patent is hereby corrected as shown below:

COLUMN 15

Line 1, "member, 901" should read --member 901,--.

COLUMN 17

Line 57, "cell" should read --cell,--.

Signed and Sealed this

Fifteenth Day of August, 1995

Attest:

BRUCE LEHMAN

Attesting Officer    Commissioner of Patents and Trademarks